United States Patent
Ludden et al.

(10) Patent No.: US 7,089,406 B2
(45) Date of Patent: Aug. 8, 2006

(54) METHOD AND APPARATUS FOR CONTROLLING PROGRAM INSTRUCTION COMPLETION TIMING FOR PROCESSOR VERIFICATION

(75) Inventors: John Martin Ludden, Essex Junction, VT (US); Darin Marcus Greene, Austin, TX (US); David A. Schroter, Round Rock, TX (US); Wallace Keith Sharp, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 484 days.

(21) Appl. No.: 10/457,610

(22) Filed: Jun. 9, 2003

(65) Prior Publication Data

US 2004/0250050 A1    Dec. 9, 2004

(51) Int. Cl.
*G06F 9/00* (2006.01)
(52) U.S. Cl. ....................... 712/218
(58) Field of Classification Search ............ 712/218; 703/19, 21, 22, 26
See application file for complete search history.

(56) References Cited

U.S. PATENT DOCUMENTS

| | | | |
|---|---|---|---|
| 5,301,335 A * | 4/1994 | Langan et al. | 712/218 |
| 5,845,109 A * | 12/1998 | Suzuki et al. | 713/401 |
| 6,470,481 B1 * | 10/2002 | Brouhard et al. | 716/5 |
| 6,473,772 B1 * | 10/2002 | Barrett et al. | 707/104.1 |
| 6,490,716 B1 * | 12/2002 | Gupta et al. | 716/18 |

* cited by examiner

*Primary Examiner*—Eric Coleman
(74) *Attorney, Agent, or Firm*—Mitch Harris, Atty at Law, LLC; Andrew M. Harris; Casimer K. Salys

(57) ABSTRACT

A method and apparatus for controlling program instruction completion timing for processor verification provides, alternatively or in combination, an improved simulation technique and/or processor in which resource allocation as well as other performance-specific scenarios can be stressed over typical operating conditions by controlling the completion timing of one or more program instructions. A high-level program controlling simulation of a VHDL model of a processor can simulate extension of the completion time of a predetermined instruction in order to hold the instruction in the execution and completion queues, placing an effective hold on the resources allocated for the instruction. Alternatively, the VHDL model may include logic for controlling completion timing of the program instruction by using a processor clock cycle counter. Verification testing of actual processor hardware may be facilitated by including the counter and associated control logic within production or prototype processors.

20 Claims, 4 Drawing Sheets

METHOD AND APPARATUS FOR CONTROLLING PROGRAM INSTRUCTION COMPLETION TIMING FOR PROCESSOR VERIFICATION

BACKGROUND OF THE INVENTION

1. Field of the Invention

The present invention is related to processor verification and simulation software, as well as to processor hardware implementations that provide support for product verification and test.

2. Description of Related Art

Modern processors and processing systems increasingly incorporate high degrees of parallelism and on-the-fly optimization (e.g., execution re-ordering) that cause completion timing of individual program instructions (usually determined in numbers of processor clock cycles) to vary significantly. Further, a number of resources, e.g., internal registers, caches and queues are typically provided in sufficient quantity to avoid frequent full allocation of resources.

Verification of processor and processing systems includes software simulation and hardware test. Simulation of processor operation is performed during design of a processor and also during design step iterations after prototype and/or production parts have been manufactured. Simulation is typically carried out using workstation computer systems running high-level software that stimulates and simulates a circuit model of the processor, which is typically a Very High-level Description Language (VHDL) circuit model. Hardware test is performed on both prototype devices and production devices, with more in-depth (lengthier) test sequences reserved for the pre-production verification environment. The purpose of verification, both in simulation and hardware test, is to ensure that increasingly complex processor and processing system designs operate as intended.

However, effective simulation of very complex designs requires extremely lengthy and complex test and simulation sequences, since ideally all states of the logical circuit comprising the process should be verified. In actuality, all states may not be verifiable, and the above-mentioned parallelism and on-the-fly optimization of modern processors complicates the simulation and testing process, as it may be difficult to cause a processor or processing system to reach the limits of resource usage and otherwise reach similar states that are only entered under unusual operating conditions. In other words, it may not be possible to exercise such an optimizing processor in order to reach the resource limits and test logic that handles resource over-demand and other conditions that occur during high resource usage, unless artificially-induced high-resource-demand conditions can be introduced.

In the past, simulation of the above-described high-resource-demand conditions has been attempted by a test program instructions including program instructions that require many cycles to complete, such as load instructions that miss the data cache, floating point divides or square root computation, and sequences of instructions having interdependencies. Execution of such instructions are simulated in order to tie up resources for as long as possible, but fall short of the desired degree of control that is necessary to detect and analyze a particular defect and control resource usage, in particular to simulate processing scenarios that have high levels of resource usage. As described above with respect to simulation, testing of actual devices could be further facilitated by providing mechanisms within a processor that facilitate exercising resources in order to enter states that are difficult to reach during normal test program execution.

Therefore, it would be desirable to provide a method and apparatus that provide control of program instruction completion time both in simulation and test verification environments.

SUMMARY OF THE INVENTION

The above objective of providing control of program instruction execution time is accomplished in a method and apparatus. The method may be embodied in a computer system executing program instructions for simulating a processor by carrying out the steps of the method and may further be embodied in a computer program product containing program instructions in computer-readable form for carrying out the steps of the method. The method and apparatus may be embodied in logic within a processor providing control of actual completion time for one or more program instructions. The method when carried out in software may comprise a VHDL model of the apparatus, or may comprise steps performed in a high-level control program simulating and stimulating a VHDL model of a standard processor, that provide control of program instruction completion time.

The method and apparatus receive a particular program instruction, execute the program instruction, detect assertion of a completion indication for the program instruction and delay completion of the program instruction until a predetermined number of processor clock cycles has expired. The count may be commenced upon the start of program instruction execution, providing control of a total number of clock cycles, or upon detecting assertion of the completion indication, providing extension of the program instruction execution time. The apparatus includes a counter for counting processor clock cycles and logic for detecting receipt of the predetermined program instruction, controlling the counter and blocking assertion of a completion signal until the predetermined number of processor clock cycles has expired.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

Figure 1:
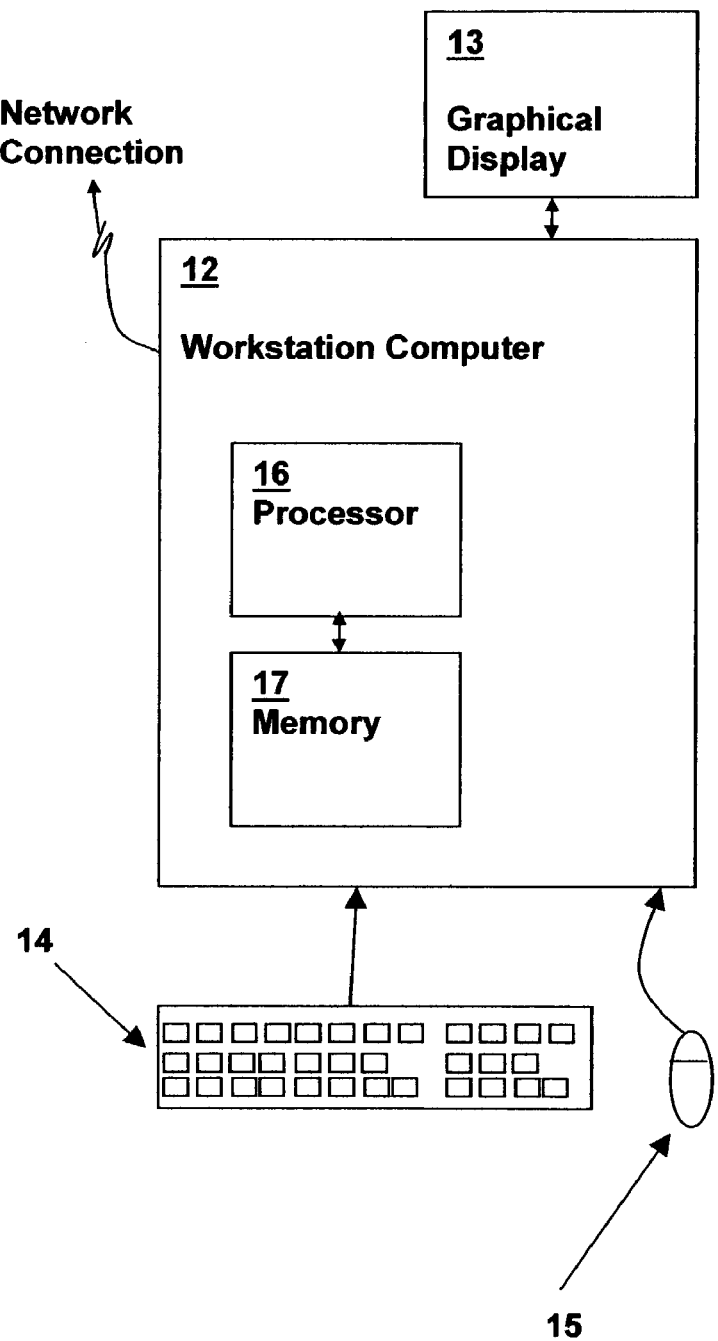
FIG. 1 is a pictorial diagram of a workstation computer system in which methods in accordance with an embodiment of the present invention are performed.

Referring to the figures, and particularly to FIG. 1, a workstation computer system, in which methods according to an embodiment of the present invention are performed, is depicted. A workstation computer 12, having a processor 16 coupled to a memory 17, for executing program instructions from memory 17, wherein the program instructions include program instructions for executing one or more methods in accordance with an embodiment of the present invention.

Workstation computer 12 is coupled to a graphical display 13 for displaying program output such as simulation results and circuit structure input and verification programs implementing embodiments of the present invention. Workstation computer 12 is further coupled to input devices such as a mouse 15 and a keyboard 14 for receiving user input. Workstation computer may be coupled to a public network such as the Internet, or may be coupled to a private network such as the various "intra-nets", or may not be connected to any network at all, and software containing program instructions embodying methods in accordance with embodiments of the present invention may be located on remote computers or locally within workstation computer 12.

Figure 2A:
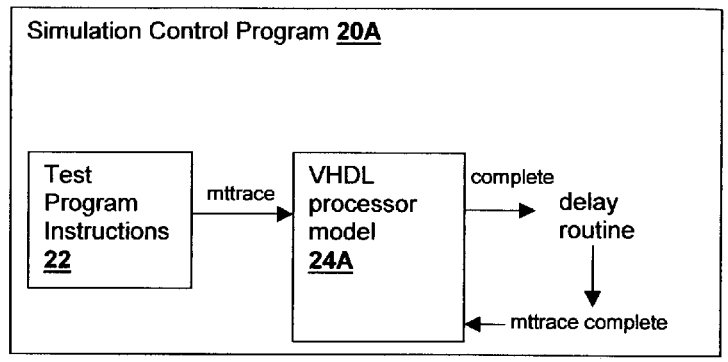
FIGS. 2A and 2B are block diagrams depicting software module organizations in memory within a computer system in accordance with embodiments of the present invention.

Referring now to FIG. 2A, an organization of software modules within memory 17 in accordance with an embodiment of the present invention is shown. A simulation control program 20A provides simulation and stimulus of a processor circuit modeled as a VHDL representation 24A of the processor logic. Test program instructions 22 provide a test program for exercising the VHDL model 24A, whereby simulation control program 20A can exercise and observe the performance of the simulated processor core. The present invention is directed to providing a mechanism for causing a processor (including VHDL model 24A) to allocate resources and hold them for an instruction longer than would ordinarily be possible, by delaying completion of at least one particular instruction or instruction type, so that resources allocated for that instruction are held during execution of other instructions, permitting test program 22 to cause the processor model 24A to reach higher levels of resource allocation than would generally occur without the delay.

Within the embodiment depicted in FIG. 2A, the above-described delay is provided by a delay routine within simulation control program 20A that hooks the completion indication provided by the VHDL processor model for a particular instruction—the mttrace instruction, and delays the completion signal for a predetermined number of processor cycles in order to extend the completion time of the mttrace instruction. The mttrace instruction, which is a special instruction directing a data move to a trace register was chosen for the reason that the mttrace instruction is managed by supervisory control logic within processor model 24A, rather than by standard execution units within the processor core. Therefore, the completion indication was already accessible to simulation control program 20A and simulation control program 20A had ready control of the completion signal delivery for the mttrace instruction. However, the present invention can be practiced with appropriate software or with a hardware model that delays any predetermined instruction or instructions in order to accomplish the goal of tying up resources for a controllable interval.

The above-described delay may be accomplished in at least two manners, both of which are contemplated by the present invention. The first is to start the delay counter after receipt of the completion indication and to deliver the completion indication to the ordinary destination (generally the instruction sequencer unit) within VHDL model 24A, thus adding a number of processor clock cycles to the execution time of the instruction. An alternative technique is to start the delay counter upon receipt (dispatch) of the instruction, thus generating a fixed overall execution interval for the instruction (as long as the counter is set to a number of processor cycles greater than the maximum number of clock cycles required for execution of the instruction).

Figure 2B:
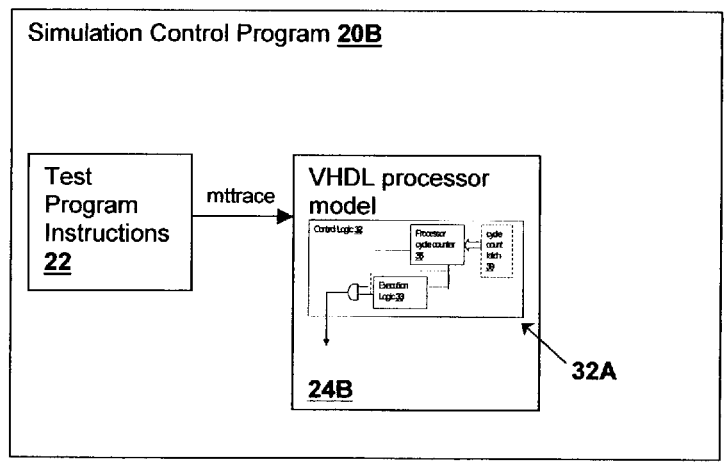

Referring now to FIG. 2B, an alternative simulation control program 20B located within memory 17 is depicted. Simulation control program 20B differs from simulation control program 20A in that a VHDL model 24B contains control logic 32A including a counter for performing the above-described delay operation. Thus simulation control program 20B may be a standard simulation program and the processor model contains a model of logic comprising an embodiment of the present invention that extends allocation of resources for a particular program instruction past the normal completion time for the particular program instruction. A processor model 24B having such logic can be fabricated to produce production and/or prototype processors containing such logic to provide a mechanism for exercising the actual hardware during verification or production test.

Figure 3:
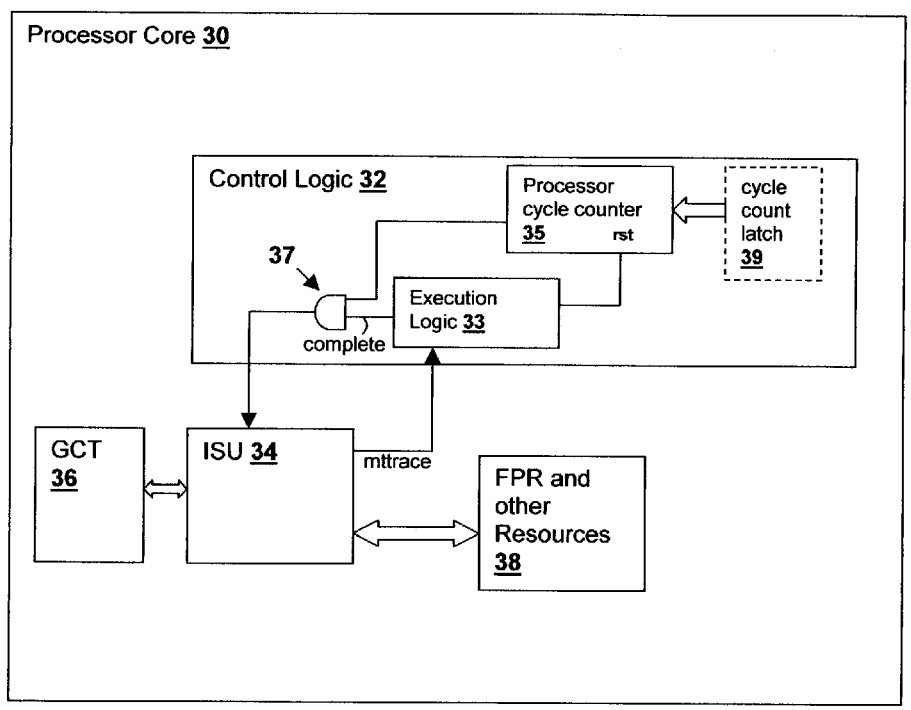
FIG. 3 is a block diagram of a processor and processor model in accordance with an embodiment of the present invention.

Referring now to FIG. 3, a block diagram of a processor in accordance with an embodiment of the present invention, and similarly a processor model in accordance with the requirements of processor model 24B described above is depicted in a block diagram. Control logic 32 receives a signal from an instruction sequencer unit (ISU) 34 indicating that an mttrace instruction has been received by ISU 34. (Alternatively, the mttrace indication may be generated by an instruction decode within control logic 32 upon delivery of a more general instruction class indication from ISU 34). The mttrace indication is received by execution logic 33, which is the logic used to implement the standard functionality of the instruction (i.e., the action taken by the processor for the instruction without the delay of the present invention). Execution logic 33, upon completion of the instruction, ordinarily delivers a completion signal to ISU 34 which is used to remove a completion table entry within global completion table 36 for the instruction. However, an AND gate 37 is used to block delivery of the completion signal to ISU 34 until a processor cycle counter 35 has reached a predetermined count level.

A cycle count latch 39 is optionally provided to permit programming of the predetermined count level by preloading counter 35 or by setting a comparison threshold for a count value of processor cycle counter 35. Processor cycle counter 35 has a reset input coupled to execution logic 33 for resetting counter either upon receipt of the particular instruction (to control total completion time) or upon assertion of the completion indication to AND gate 37 (to extend completion time for a fixed interval). While AND gate 37 blocks the completion indication, resources such as fixed point registers and other resources 38 allocated for the execution of the particular instruction are effectively locked.

Figure 4:
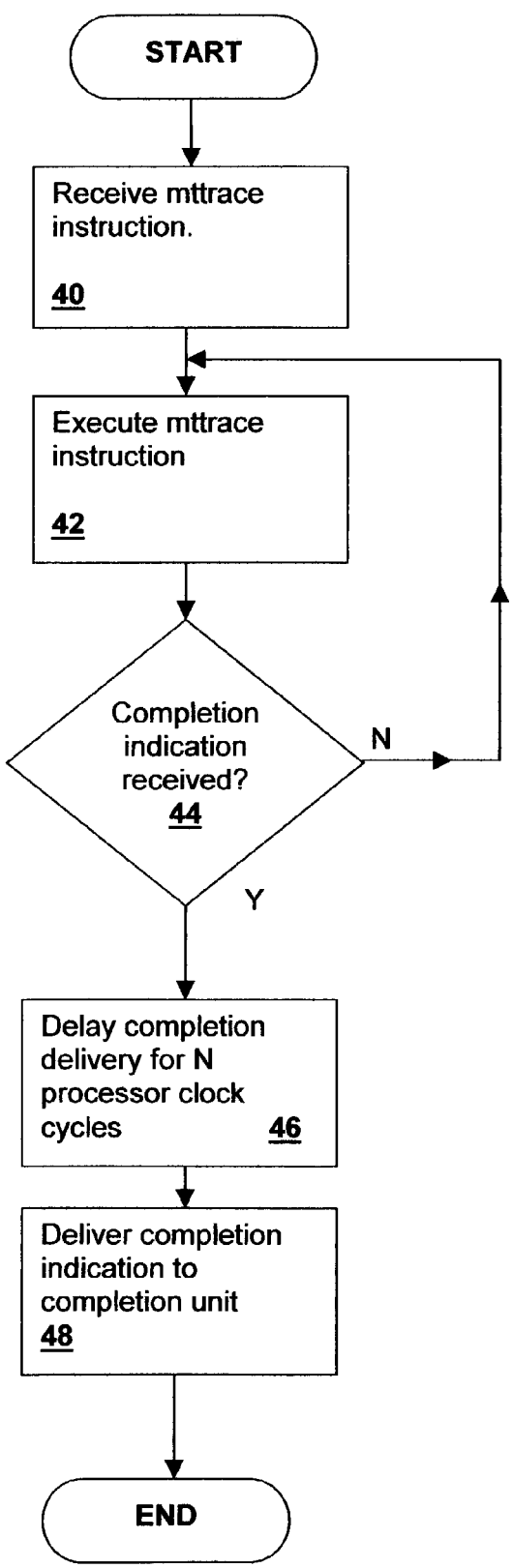
FIG. 4 is a flow chart of a method in accordance with an embodiment of the present invention.

Referring now to FIG. 4, a method in accordance with an embodiment of the present invention is depicted in a flowchart. First, the particular instruction (mttrace) instruction is received (step 40) and executed (step 42). Execution state continues until a completion indication is received (decision 44). Next, the completion indication is delayed for N processor clock cycles (step 46). Finally the completion indication is delivered to the completion unit (step 48) within ISU 34. The N clock cycle delay described above, is either a fixed delay that extends the instruction completion time by N cycles, or is equal for each execution of the particular instruction to the Total number of cycles desired for execution length of the particular instruction minus the actual execution length for the specific execution. In actuality, the delay of N in the second case merely represents an additional number of cycles over a number of cycles already counted for the instruction execution.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for simulating high resource usage conditions within a processor, said method comprising:
   receiving a program instruction;
   determining whether or not said program instruction is a specific instruction designated for delaying a release of resources used for execution of said program instruction;
   responsive to said receiving, executing said program instruction, whereby a completion indication is generated in response to completion of said program instruction;
   responsive to determining that said program instruction is of said specific type, counting a number of processor clock cycles after said completion indication is generated;
   during said counting, delaying said completion indication until said counting is completed, whereby an instruction cycle time of said specific program instruction is increased to delay release of said resources; and
   responsive to completion of said counting, delivering said completion indication to a completion unit that causes release of said resources.

2. The method of claim 1, wherein said counting is performed in a high-level program controlling simulation of a model of said processor, wherein said high-level program detects completion of said program instruction to produce said completion indication and initiate said counting, and wherein said delaying and delivering are performed by said high-level program.

3. The method of claim 1, wherein said counting is performed by a processor cycle counter within a model of said processor, and wherein said receiving, delaying and delivering are performed within said model of said processor.

4. The method of claim 1, wherein said counting is performed by a processor cycle counter within said processor, and wherein said receiving, delaying and delivering are performed by logic within said processor.

5. The method of claim 4, further comprising resetting said processor cycle counter in response to receiving said program instruction, whereby said delaying is performed for a fixed interval including time elapsed during said executing.

6. The method of claim 4, further comprising resetting said processor cycle counter in response to said generating said completion indication, whereby said delaying is performed for a fixed interval subsequent to completing said executing.

7. A workstation computer system including a memory for storing program instructions and data, and a processor for executing said program instructions, and wherein said program instructions and data comprise program and instructions and data for:
   modeling behavior of a processor with a processor model, said processor model including an instruction decoder for decoding program instructions and determining whether said program instruction is a specific program instruction specially designated for delaying a release of resources used in execution of said specific program instruction, a resource control for allocating said resources, an execution unit for executing said program instruction and providing an indication of completion of said particular program instruction, and a completion unit for receiving said indication and releasing said allocated resources upon delivery of said indication of completion to said completion unit;
   simulating operation of said processor model with a simulation control program; and
   delaying delivery of said indication of completion to said completion unit for a number of processor clock cycles if said instruction decoder determines that said program instruction is said specific program instruction, and wherein said modeling delivers said indication of completion to said completion unit without a delay if said instruction decoder determines that said program instruction is not said specific program instruction, whereby said completion unit releases said allocated resources without said delay.

8. The workstation computer system of claim 7, wherein said program instructions and data for delaying comprise program instructions within said simulation control program, whereby said indication of completion is received and said program instructions for delaying count said number of processor cycles before delivering said indication of completion to said processor model.

9. The workstation computer system of claim 7, wherein said program instructions and data for delaying comprise program instructions and data within said processor model implementing a counter and control logic within said model for delaying said indication of completion.

10. The workstation computer system of claim 7, wherein said program instructions and data for delaying delay delivery of said indication of completion for said number of clock cycles after receipt of another indication from said instruction decoder that said program instruction is said specific program instruction.

11. The workstation computer system of claim 7, wherein said program instructions and data for delaying delay delivery of said indication of completion for said number of clock cycles after said execution unit provides said indication of completion.

12. A computer program product comprising a computer readable storage media containing program instructions and data for execution on a general-purpose computer system, wherein said program instructions and data comprise program instructions and data for:
   modeling behavior of a processor with a processor model, said processor model including an instruction decoder for decoding program instructions and determining whether said program instruction is a specific program instruction specially designated for delaying a release of resources used in execution of said specific program instruction, a resource control for allocating said resources, an execution unit for executing said program instruction and providing an indication of completion of said particular program instruction, and a completion unit for receiving said indication and releasing said allocated resources upon delivery of said indication of completion to said completion unit;
   simulating operation of said processor model with a simulation control program; and
   delaying delivery of said indication of completion to said completion unit for a number of processor clock cycles if said instruction decoder determines that said program instruction is said specific program instruction, and wherein said modeling delivers said indication of completion to said completion unit without a delay if said instruction decoder determines that said program instruction is not said specific program instruction, whereby said completion unit releases said allocated resources without said delay.

13. The computer program product of claim 12, wherein said program instructions and data for delaying comprise program instructions within said simulation control program, whereby said indication of completion is received and said program instructions for delaying count said number of processor cycles before delivering said indication of completion to said processor model.

14. The computer program product of claim 12, wherein said program instructions and data for delaying comprise program instructions and data within said processor model implementing a counter and control logic within said model for delaying said indication of completion.

15. The computer program product of claim 12, wherein said program instructions and data for delaying delay delivery of said indication of completion for said number of clock cycles after receipt of another indication from said instruction decoder that said program instruction is said specific program instruction.

16. The computer program product of claim 12, wherein said program instructions and data for delaying delay delivery of said indication of completion for said number of clock cycles after said execution unit provides said indication of completion.

17. A processor, comprising:
 an instruction decoder said for providing a first indication of receipt of a program instruction and determining whether or not said program instruction is a specific program instruction specially designated for delaying a release of resources used in execution of said specific program instruction;
 a resource allocation logic for allocating resources for use in executing said program instruction;
 an execution unit coupled to said instruction decoder for executing said program instruction and generating an indication of completion of said program instruction;
 a completion unit for receiving said indication of completion and releasing said allocated resources; and
 a delay circuit comprising a processor cycle counter coupled to said completion unit for delaying delivery of said indication of completion from said execution unit to said completion unit by a number of processor cycles when said instruction decoder determines that said program instruction is said specific program instruction.

18. The processor of claim 17, further comprising a programmable count value latch coupled to said processor cycle counter for holding said number of processor cycles, whereby said number of processor cycles is adjusted.

19. The processor of claim 17, wherein said processor cycle counter is coupled to said execution unit for resetting said processor cycle counter when said second indication is asserted, whereby said delay circuit delays said delivery of said indication of completion by said predetermined number of processor cycles after completion of execution of said specific program instruction by said execution unit.

20. The processor of claim 17, wherein said processor cycle counter is coupled to said instruction decoder for resetting said processor cycle counter when said first indication is asserted, whereby said delay circuit delays said delivery of said second indication by said predetermined number of processor cycles after receipt of said specific program instruction by said execution unit.

* * * * *